United States Patent
Sakai (10) Patent No.: US 8,795,815 B2
(45) Date of Patent: Aug. 5, 2014

(54) LAMINATED STRUCTURE

(75) Inventor: Masashi Sakai, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 667 days.

(21) Appl. No.: 12/101,224

(22) Filed: Apr. 11, 2008

(65) Prior Publication Data

US 2009/0087624 A1 Apr. 2, 2009

(30) Foreign Application Priority Data

Oct. 2, 2007 (JP) ................................. 2007-258535

(51) Int. Cl.
*B32B 7/02* (2006.01)
*B32B 3/02* (2006.01)
*H05K 3/46* (2006.01)

(52) U.S. Cl.
CPC ... *B32B 3/02* (2013.01); *B32B 7/02* (2013.01); *H05K 3/4638* (2013.01)
USPC .......................................... 428/192; 428/212

(58) Field of Classification Search
CPC ........... H05K 3/4638; B32B 3/02; B32B 7/02
USPC ........................ 428/188, 72, 184, 192, 212; 385/129–132; 156/256, 264
See application file for complete search history.

(56) References Cited

U.S. PATENT DOCUMENTS

| | | | | |
|---|---|---|---|---|
| 4,648,607 A | * | 3/1987 | Yamada et al. | 277/598 |
| 4,666,546 A | * | 5/1987 | Treber | 156/264 |
| 5,923,112 A | * | 7/1999 | Bertocchi et al. | 310/216.048 |
| 2007/0128450 A1 | | 6/2007 | Mori et al. | |
| 2008/0164661 A1 | * | 7/2008 | Imai | 277/598 |

FOREIGN PATENT DOCUMENTS

| | | |
|---|---|---|
| DE | 197 42 839 A1 | 6/1998 |
| JP | 2016096 A | 1/1990 |
| JP | 2-82585 | 6/1990 |
| JP | 62-27144 A | 8/1994 |
| JP | 10-209640 A | 8/1998 |
| JP | 2002-223054 A | 8/2002 |
| JP | 200387009 A | 3/2003 |

OTHER PUBLICATIONS

Japanese Office Action dated Sep. 29, 2009.
German Office Action dated Jul. 24, 2013 in corresponding German Application 10 2008 018 241.9.

* cited by examiner

*Primary Examiner* — Prashant J Khatri
(74) *Attorney, Agent, or Firm* — Sughrue Mion, PLLC (57) ABSTRACT

The present invention relates to a laminated structure for realizing an arbitrary hollow structure by laminating in a predetermined order a plurality of plate-like members formed by punching in an arbitrary configuration. The plurality of plate-like members have a plurality of identification structure portions for individually identifying the plate-like members, and the plurality of identification structure portions are on the same side surface of a laminated structure thus obtained.

16 Claims, 8 Drawing Sheets

LAMINATED STRUCTURE

BACKGROUND OF THE INVENTION

1. Field of the Invention

The present invention relates to a laminated structure which is applicable to the fields of a high-frequency antenna, a waveguide, etc. and which realizes an arbitrary hollow structure through lamination in a predetermined order of a plurality of plate-like members formed by punching in an arbitrary configuration.

2. Description of the Related Art

In recent years, there have been developed an antenna, a waveguide, etc. formed by a plurality of plate-like members, blocks or the like. For example, there exist a waveguide diplexer and a waveguide of a laminated structure formed by laminating a plurality of plate-like members in a signal propagating direction or in a direction crossing the signal propagating direction. This structure makes it possible to suppress a dimensional error in the thickness direction of the plate-like members, which are formed by machining, thereby enabling to attain an improvement in terms of precision regarding configuration and dimension (see, for example, JP 2003-87009 A).

In the waveguide structure as disclosed in JP 2003-87009 A, a plurality of plate-like members laminated have mating markers, so mating of the plurality of plate-like members is possible. However, it is not easy to ascertain the laminating order of the plate-like members, the top-bottom direction and the front-back direction of the plate-like members at the time of lamination, redundancy of plate-like members laminated, absence of plate-like members to be laminated, etc., so it is impossible to distinguish between defective and non-defective products. In particular, when all the plate-like members laminated have the same thickness, it is utterly impossible to ascertain the laminating order, and any defect can only be picked out through property test or inspection.

SUMMARY OF THE INVENTION

The present invention has been made with a view toward solving the above-mentioned problem with the related art. It is an object of the present invention to provide a laminated structure realizing an arbitrary hollow structure through lamination in a predetermined order of a plurality of plate-like members formed by punching in an arbitrary configuration, in which the laminated structure can be easily checked for the laminating order of the plate-like members, the top-bottom direction and the front-back direction of the plate-like members at the time of lamination, redundancy of plate-like members laminated, absence of plate-like members to be laminated, etc.

According to the present invention, there is provided a laminated structure for realizing an arbitrary hollow structure by laminating in a predetermined order a plurality of plate-like members formed by punching in an arbitrary configuration, in which the plurality of plate-like members have a plurality of identification structure portions for individually identifying the plate-like members on a side surface thereof, and in which the plurality of identification structure portions are on the same side surface of a laminated structure thus obtained.

According to the present invention, the plurality of plate-like members have a plurality of identification structure portions for individually identifying the plate-like members, and the plurality of identification structure portions are on the same side surface of the laminated structure, whereby it is possible to easily check the laminated structure for the laminating order of the plate-like members, the top-bottom direction and the front-back direction of the plate-like members at the time of lamination, redundancy of plate-like members laminated, absence of plate-like members to be laminated, etc.

DETAILED DESCRIPTION OF THE PREFERRED EMBODIMENTS

Embodiment 1

Figure 1:
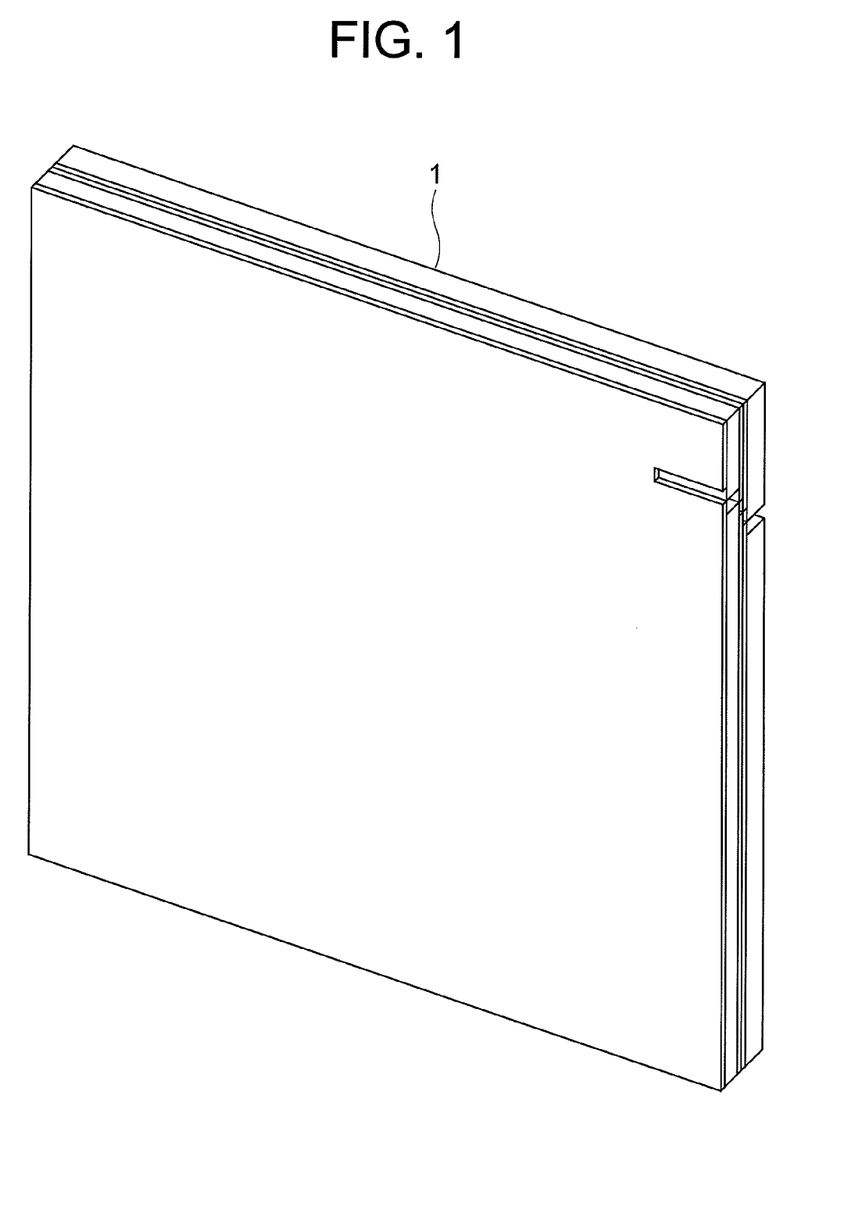
FIG. 1 is a overall view of a laminated structure according to Embodiment 1 of the present invention.
Figure 2:
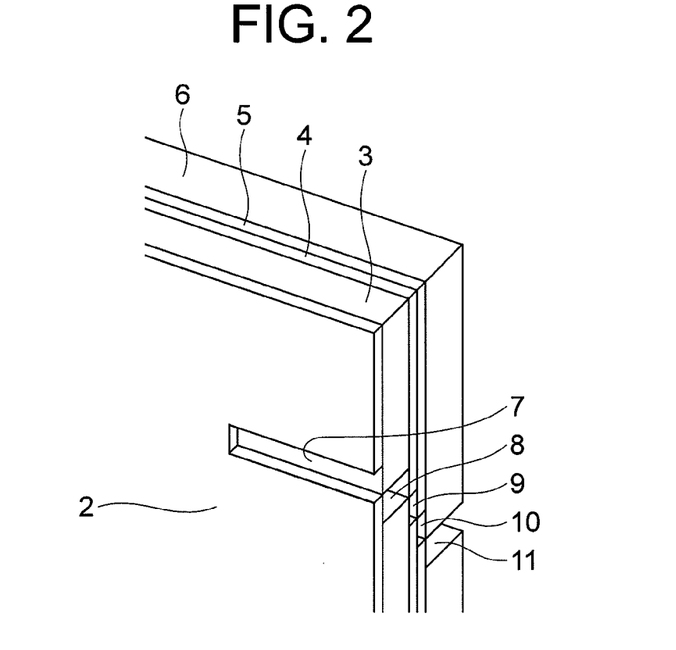
FIG. 2 is an enlarged perspective view of the laminated structure of Embodiment 1 of the present invention.
Figure 3:
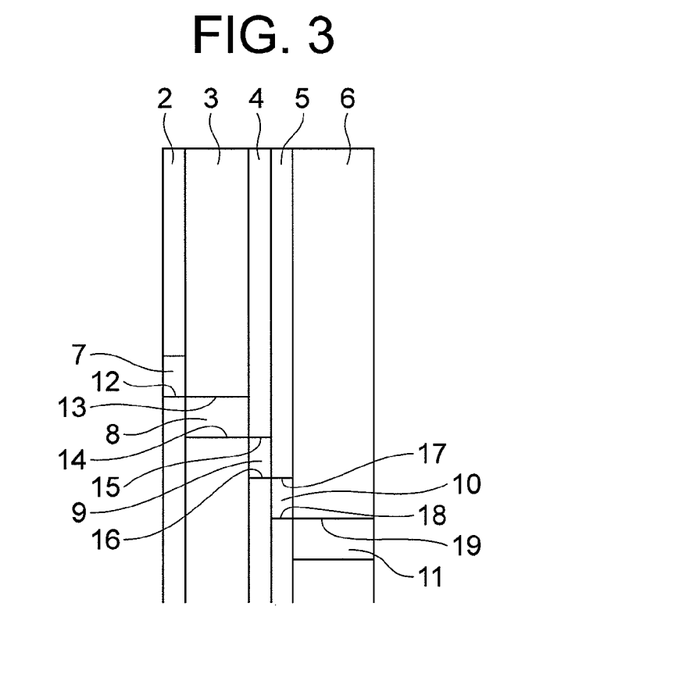
FIG. 3 is an enlarged right-hand side view of the laminated structure of Embodiment 1 of the present invention.

FIGS. 1 through 5 are diagrams showing a laminated structure according to Embodiment 1 of the present invention. Of those drawings, FIG. 1 is a diagram illustrating, for example, a case in which cutouts as identification structure portions are provided in the same side surfaces of the plate-like members, FIG. 2 is an enlarged view of the cutouts of FIG. 1, and FIG. 3 is an enlarged side view of the cutouts of FIG. 1. A laminated structure 1, shown in FIG. 1, is applicable to the fields of a high-frequency antenna, a waveguide, etc.; it realizes an arbitrary hollow structure through lamination in a predetermined order of a plurality of plate-like members formed by punching in an arbitrary configuration. The plurality of plate-like members are successively laminated in the following order: a first plate-like member 2; a second plate-like member 3; a third plate-like member 4; a fourth plate-like member 5; and a fifth plate-like member 6.

FIGS. 2 and 3 show a state in which the laminating order is correct. Cutouts as identification structure portions of the plate-like members extend in a direction perpendicular to the direction in which the plurality of plate-like members are laminated, with their positions differing from plate-like member to plate-like member. A first cutout 7 is provided in a side surface of the first plate-like member 2, a second cutout 8 is provided in a side surface of the second plate-like member 3, a third cutout 9 is provided in a side surface of the third plate-like member 4, a fourth cutout 10 is provided in a side surface of the fourth plate-like member 5, and a fifth cutout 11 is provided in a side surface of the fifth plate-like member 6; those cutouts are provided in the same side surface of the laminated structure.

Here, the first cutout 7 on the upper side and the second cutout 8 on the lower side are arranged such that the end point of a bottom portion 12 of the first cutout is matched with the end point of a top portion 13 of the second cutout. Similarly, the second cutout 8 and the third cutout 9 are arranged such that the end point of a bottom portion 14 of the second cutout is matched with the end point of a top portion 15 of the third cutout; the end point of a bottom portion 16 of the third cutout is matched with the end point of a top portion 17 of the fourth cutout; and the end point of a bottom portion 18 of the fourth cutout is matched with the end point of a top portion 19 of the fifth cutout; the cutouts are arranged such that they do not overlap each other when the plate-like members are viewed from a direction parallel to the laminating direction (from left to right, or right to left, in FIG. 3). The widths of the cutouts in the direction perpendicular to the direction in which the plate-like members are laminated may differ from plate-like member to plate-like member.

Figure 4:
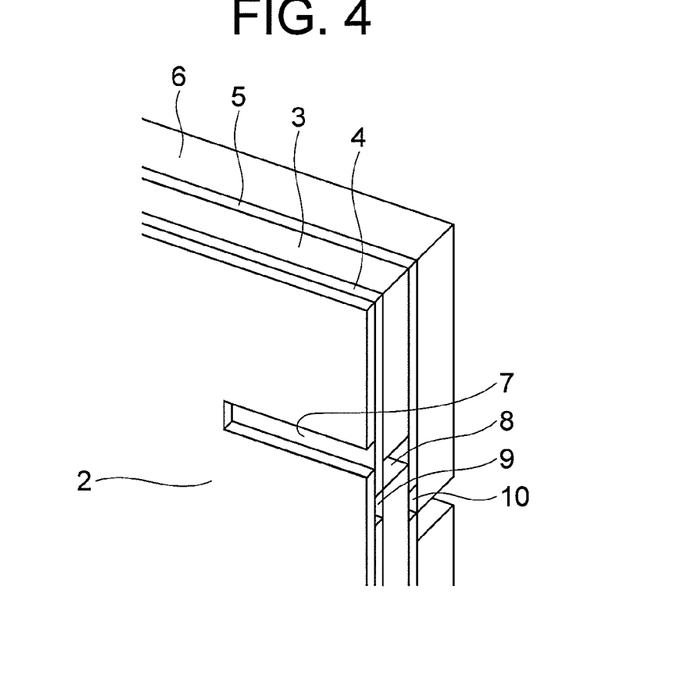
FIG. 4 is an enlarged view illustrating an error in laminating order in the laminated structure of Embodiment 1 of the present invention.
Figure 5:
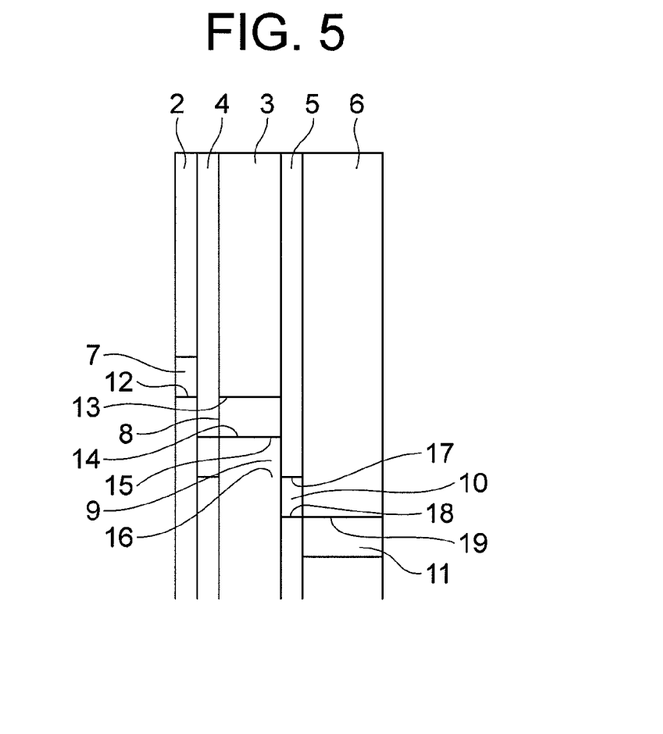
FIG. 5 is an enlarged right-hand side view illustrating an error in laminating order in the laminated structure of Embodiment 1 of the present invention.

FIGS. 4 and 5 are diagrams showing a case in which the laminating order of the second plate-like member 3 and the third plate-like member 4 are reversed. When the laminating order is not correct, the cutouts are not arranged continuously as in the case of FIGS. 2 and 3. When the identification structure portions for individually identifying the plurality of plate-like members are thus arranged incorrectly, it is possible to ascertain the laminating order of the plate-like members, the top-bottom direction and the front-back direction of the plate-like members at the time of lamination, redundancy of plate-like members laminated, and absence of plate-like members to be laminated. While in Embodiment 1 of the present invention, the identification structure portions for individually identifying a plurality of plate-like members are cutouts of an arbitrary configuration, the same effect can be obtained by providing, instead of the cutouts, identification structure portions in the form of protrusions or the like of an arbitrary configuration.

Embodiment 2

Figure 6:
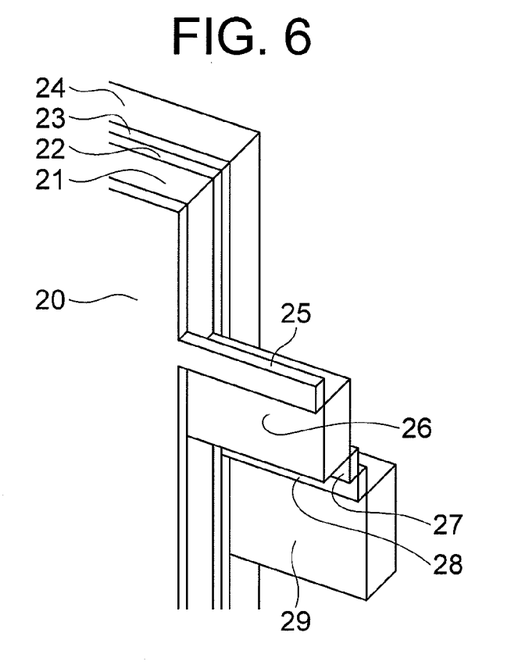
FIG. 6 is an enlarged perspective view of a laminated structure according to Embodiment 2 of the present invention.
Figure 7:
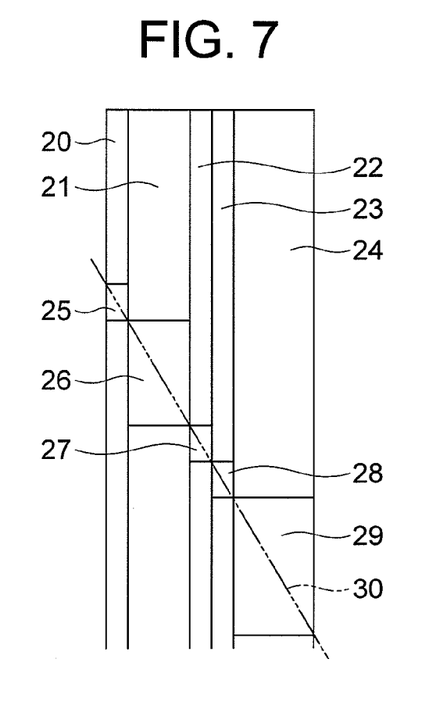
FIG. 7 is an enlarged right-hand side view of the laminated structure of Embodiment 2 of the present invention.

FIGS. 6 and 7 are diagrams showing a laminated structure according to Embodiment 2 of the present invention, illustrating, for example, a case in which protrusions are provided as the identification structure portions on the same side surfaces of the plate-like members; FIG. 6 is an enlarged view of the protrusions, and FIG. 7 is an enlarged side view of the protrusions. In Embodiment 2, the laminating order of the plurality of plate-like members and the arrangement of the identification structure portions are the same as those of Embodiment 1; this embodiment differs from Embodiment 1 in that, for the identification structure portions, protrusions are provided instead of the cutouts, and that the width of each cutout in the direction perpendicular to the direction in which the plate-like members are laminated is of a length determined at a predetermined ratio with respect to the thickness of each plate-like member.

The widths of protrusions 25 through 29 of respective plate-like members 20 through 24 in a direction perpendicular to the laminating direction of the plate-like members are as follows: assuming, for example, that the ratio of the thickness of each plate-like member to the width of the protrusion thereof is 1:2, when the thickness of the first plate-like member 20 is 1 mm, the width of the first protrusion 25 is 2 mm. Similarly, when the thickness of the second plate-like member 21 is 3 mm, the width of the second protrusions 26 is 6 mm; when the thickness of the third plate-like member 22 is 1 mm, the width of the third protrusion 27 is 2 mm; when the thickness of the fourth plate-like member 23 is 1 mm, the width of the fourth protrusion 28 is 2 mm; and, when the thickness of the fifth plate-like member 24 is 4 mm, the width of the fifth protrusion 29 is 8 mm.

Figure 8:
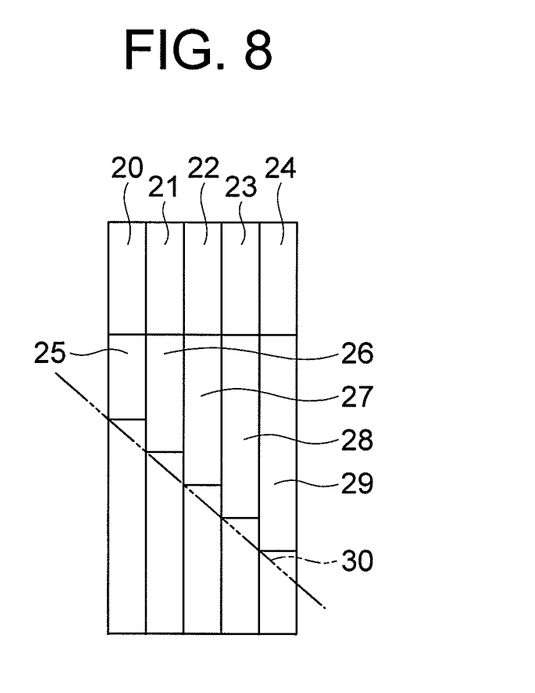
FIG. 8 is an enlarged right-hand side view of the laminated structure of Embodiment 2 of the present invention.

Further, in a side view of the first through fifth protrusions 25 through 29 in the laminated structure as shown in FIG. 7, when the front surface upper corner portion and the back surface lower corner portion of the sides of each of the protrusions 25 through 29 of the respective plate-like members 20 through 24 are connected by a diagonal line, the diagonal lines of the protrusions are arranged in a straight line 30; when the laminating order is not correct, the diagonal lines of the protrusions are not arranged in a straight line. In this way, when the identification structure portions for individually identifying the plurality of plate-like members are not arranged correctly, it is easier, as compared with Embodiment 1, to ascertain the laminating order of the plate-like members, the top-bottom direction and the front-back direction of the plate-like members at the time of lamination, redundancy of plate-like members laminated, absence of plate-like members to be laminated. Further, while in Embodiment 2 the identification structure portions for individually identifying the plurality of plate-like members are protrusions, the same effect can be obtained by providing, instead of the protrusions, identification structure portions in the form of cutouts or the like as in Embodiment 1. Further, as shown in FIG. 8, even when the plate-like members 20 through 24 have the same thickness, it is possible to ascertain the laminating order of the plate-like members 20 through 24, the top-bottom direction and the front-back direction of the plate-like members 20 through 24 at the time of lamination, redundancy of plate-like members laminated, and absence of plate-like members to be laminated.

Embodiment 3

Figure 9:
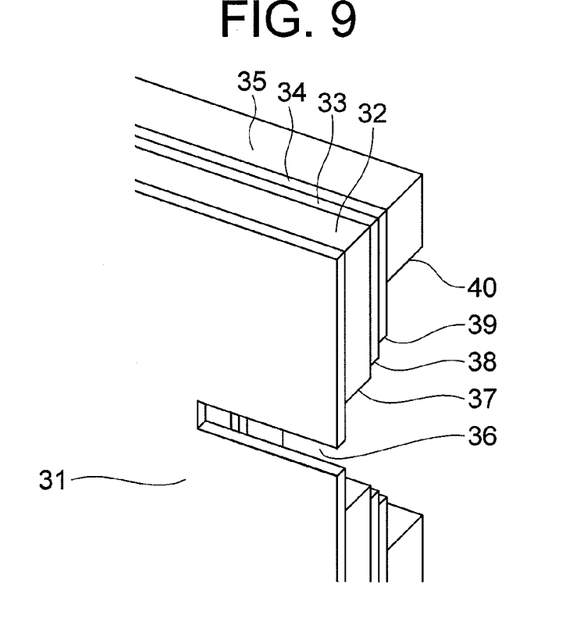
FIG. 9 is an enlarged perspective view of a laminated structure according to Embodiment 3 of the present invention.
Figure 10:
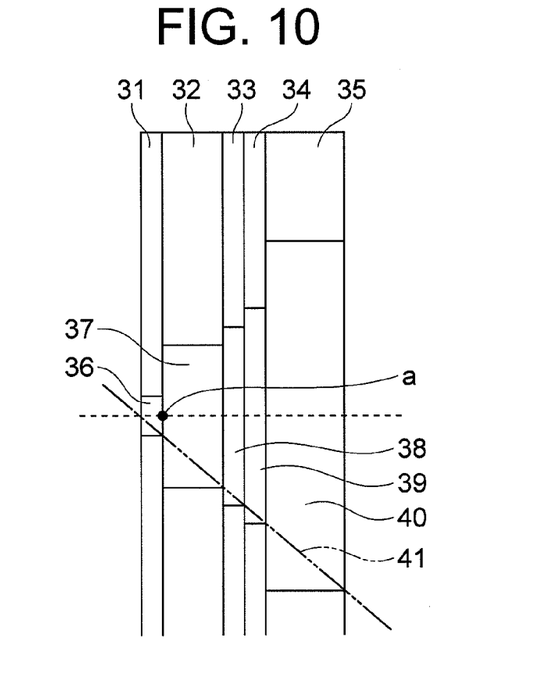
FIG. 10 is an enlarged right-hand side view of the laminated structure of Embodiment 3 of the present invention.

FIGS. 9 and 10 are diagrams showing a laminated structure according to Embodiment 3 of the present invention, illustrating, for example, a case in which cutouts as identification structure portions are provided in the same side surfaces of the plate-like members; FIG. 9 is an enlarged view of the cutouts, and FIG. 10 is an enlarged side view of the cutouts. In Embodiment 3, the laminating order of the plurality of plate-like members is the same as that in Embodiment 1; however, the width of each cutout in a direction perpendicular to the laminating direction of the plate-like members is of a length determined for each of the plate-like members at a predetermined ratio with respect to the lamination thickness as measured to the position of lamination effected successively.

In Embodiment 3, the positions of cutouts 36 through 40 of respective plate-like members 31 through 35 are determined as follows: the ratio of the lamination thickness of the plate-like members to the width of the cutout is set, for example, to 1:2, and the position of the center of the first cutout 36 of the first plate-like member 31, referred to as first cutout width center a, is used as the reference for the cutout center position of each plate-like member. Thus, when the thickness of the first plate-like member 31 is 1 mm, the width of the first cutout 36 is 2 mm. When the thickness of the second plate-like member 32 is 3 mm, the sum total of this thickness and the thickness of the first plate-like member 31 is 4 mm, so the width of the second cutout 37 is 8 mm, and the cutout position corresponds to a width of 4 mm as measured vertically with the first cutout center a therebetween. Similarly, regarding the width of the third cutout 38, when the thickness of the third plate-like member is 1 mm, the sum total of the thicknesses of the first through third plate-like members 31 through 33 is 5 mm, so the cutout width of the third cutout is 10 mm. Regarding the width of the fourth cutout 39, when the thickness of the fourth plate-like member is 1 mm, the sum total of the thicknesses of the first through fourth plate-like members 31 through 34 is 6 mm, so the cutout width is 12 mm. Regarding the width of the fifth cutout 40, when the thickness of the fifth plate-like member is 4 mm, the sum total of the thicknesses of the first through fifth plate-like members 31 through 35 is 10 mm, so the cutout width is 20 mm. As in the case of the position of the second cutout 37, the center a of the first cutout width serves as the central position each of the third through fifth cutouts 38 through 40.

Figure 11:
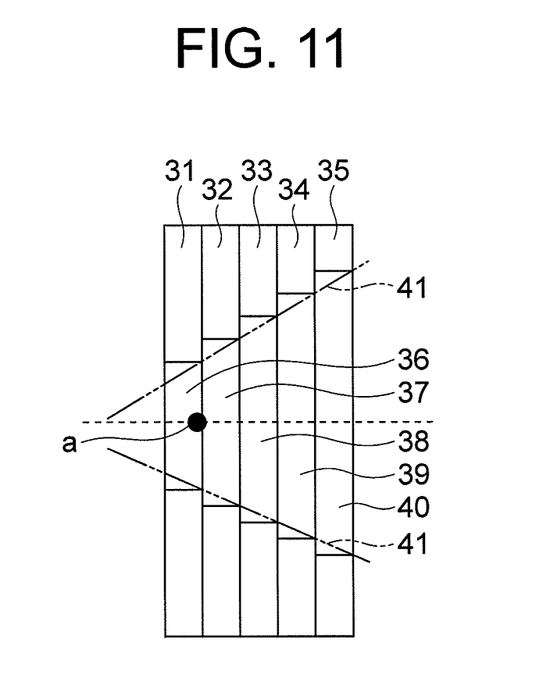
FIG. 11 is an enlarged right-hand side view of the laminated structure of Embodiment 3 of the present invention.

As shown in FIG. 10, in a side view of the laminated structure, when the bottom portions of the back sides of the first through fifth cutouts 36 through 40 of the plate-like members are connected by lines, the cutout corners are arranged in a straight line 41, and when the laminating order is not correct, the cutouts are not arranged continuously. In this way, when the identification structure portions for individually identifying the plurality of plate-like members are not arranged correctly, it is possible to ascertain the laminating order of the plate-like members, the top-bottom direction and the front-back direction of the plate-like members at the time of lamination, redundancy of plate-like members laminated, and absence of plate-like members to be laminated. While in Embodiment 3 the identification structure portions for individually identifying the plurality of plate-like members are cutouts, the same effect can be obtained by providing identification structure portions in the form of protrusions or the like instead of the cutouts. Further, as shown in FIG. 11, also when the plate-like members 31 through 35 have the same thickness, it is possible to ascertain the laminating order of the plate-like members, the top-bottom direction and the front-back direction of the plate-like members at the time of lamination, redundancy of plate-like members laminated, and absence of plate-like members to be laminated.

Embodiment 4

Figure 12:
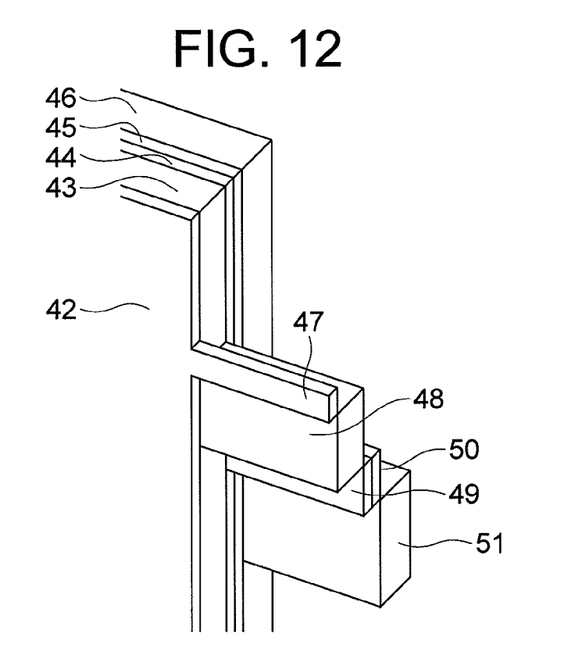
FIG. 12 is an enlarged perspective view of a laminated structure according to Embodiment 4 of the present invention.
Figure 13:
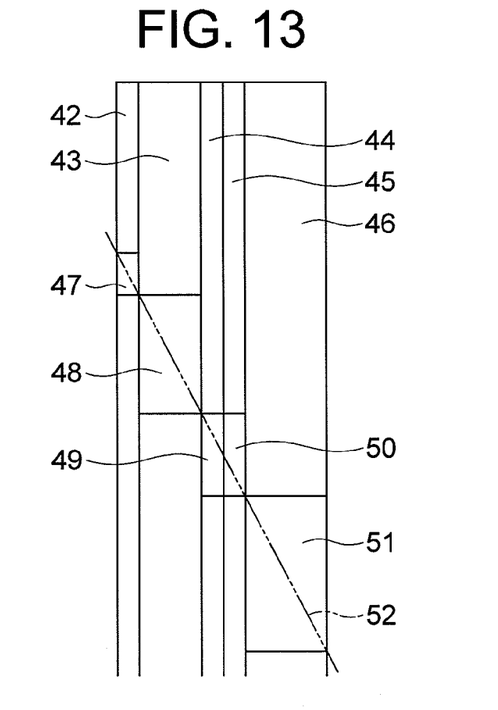
FIG. 13 is an enlarged right-hand side view of the laminated structure of Embodiment 4 of the present invention.

FIGS. 12 and 13 are diagrams showing a laminated structure according to Embodiment 4 of the present invention, illustrating, for example, a case in which protrusions are provided on the same side surfaces of the plate-like members as the identification structure portions; FIG. 12 is an enlarged view of the protrusions, and FIG. 13 is an enlarged side view of the protrusions. In Embodiment 4, the laminating order of the plurality of plate-like members and the arrangement of the identification structure portions are the same as those of Embodiment 1; Embodiment 4 differs from Embodiment 1 in that, of the plurality of plate-like members, a group of two or more plate-like members adjacent to each other at the time of lamination that are of the same configuration for realizing a hollow structure except for the identification structure portions are regarded as a unitary plate-like member, with the positions and the widths of the corresponding identification structure portions being the same.

Suppose, for example, a third plate-like member 44 and a fourth plate-like member 45 have the same configuration (not shown) for realizing a hollow structure when forming the laminated structure. Assuming that the ratio of the thickness of the plate-like member to the width of the protrusion is 1:2, when the thickness of a first plate-like member 42 is 1 mm, the width of a first protrusion 47 is 2 mm; and when the thickness of a second plate-like member 43 is 3 mm, the width of a second protrusion 48 is 6 mm. When the thickness of the third plate-like member 44 and the fourth plate-like member 45 is 1 mm, the width of a third protrusion 49 and a fourth protrusion 50 is obtained from the sum total of the thicknesses of the two plate-like members, which is 2 mm; in this case, the protrusion width is 4 mm. When the thickness of a fifth plate-like member 46 is 4 mm, the width of a fifth protrusion 51 is 8 mm.

As shown in FIG. 13, in a side view of the laminated structure, when the front upper corners and the back lower corners of the sides of the first through fifth protrusions 47 through 51 of the plate-like members perpendicular to the laminating direction are connected by diagonal lines, the diagonal lines of the protrusions are arranged in a straight line 52. When the laminating order is not correct, the diagonal lines of the protrusions are not arranged in a straight line. In this way, when the first through fifth protrusions 47 through 51, which are the identification structure portions for individually identifying the plurality of respective plate-like members 42 through 46 are not arranged correctly, it is possible to ascertain the laminating order of the plate-like members, the top-bottom direction and the front-back direction of the plate-like members at the time of lamination, redundancy of plate-like members laminated, and absence of plate-like members to be laminated.

Further, two or more plate-like members adjacent to each other at the time of lamination that are of the same configuration for realizing a hollow structure except for the protrusions are regarded as a single plate, and the positions and the widths of the protrusions are made the same. As a result, it is possible to achieve a reduction in the kinds of plate-like members as compared with the case in which the inner configurations of the plate-like members are same but in which the widths and positions of the protrusions differ, so the process of preparing drawings and the production process are shortened, thereby achieving cost reduction. Further, if the lamination is performed with a plate-like member to be laminated being absent, the absence can be found out because the diagonal lines of the protrusions are then not arranged continuously. Further, while in Embodiment 4 the identification structure portions for individually identifying the plurality of plate-like members are protrusions, the same effect can be obtained by providing identification structure portions in the form of cutouts or the like instead of the protrusions.

What is claimed is:

1. A laminated structure containing a plurality of plate-like members laminated in a predetermined order,
    wherein the plurality of plate-like members have a plurality of identification structure portions for individually identifying the plate-like members,
    wherein the plurality of identification structure portions are on a same side surface of a laminated structure thus obtained,
    wherein the plurality of identification structure portions respectively comprise cutouts that extend from an edge of a side surface of the plate-like members toward a portion of an interior of the plate-like members,
    wherein the plurality of plate-like members are laminated in a laminating direction,
    wherein each of the cutouts have a top portion and a bottom portion which are spaced apart from each other in a direction which is perpendicular to the laminating direction and parallel to the side surface of the laminated structure on which the identification structure portions are provided, and wherein the top portions and the bottom portions of the respective cutouts deviate sequentially such that both the top portions and the bottom portions of the respective cutouts are simultaneously provided farther away from a same reference plane, which is parallel to the laminating direction, as one travels in the laminating direction.

2. The laminated structure according to claim 1, wherein the plurality of identification structure portions are arranged so as to be at predetermined positions on the same side surface of the laminated structure.

3. The laminated structure according to claim 2,
wherein the plurality of the plate-like members comprise at least three plate-like members,
wherein each of the top portions and the bottom portions of the cutouts have an upper corner and a lower corner which are spaced apart from each other in the laminating direction such that each of the cutouts have an top upper corner, top lower corner, bottom upper corner, and bottom lower corner, and
wherein at least one of all of the top upper corners, all of the top lower corners, all of the bottom upper corners, and all of the bottom lower corners of the cutouts are connected by a straight line.

4. The laminated structure according to claim 3,
wherein each of the plurality of plate-like members have a thickness in the laminating direction, and
wherein the thickness of at least one of the plurality of plate-like members is different than a thickness of another of the plate-like members.

5. The laminated structure according to claim 2, wherein the plurality of cutouts are arranged such that, a position of a bottom portion a first cutout is matched with a position of a top portion of an adjacent cutout which is provided downstream from the first cutout in a laminating direction.

6. The laminated structure according to claim 5, wherein the plurality of identification structure portions do not overlap each other when viewed from a direction parallel to the laminating direction.

7. The laminated structure according to claim 1, wherein a width of each of the identification structure portions in a direction perpendicular to the laminating direction of the plate-like members is different from each other for each plate-like member.

8. The laminated structure according to claim 7, wherein there is a predetermined ratio between the width of each of the identification structure portions and a thickness of each plate-like member in the laminating direction.

9. The laminated structure according to claim 7, wherein there is a predetermined ratio between the width of each of the identification structure portions and a lamination thickness measured between respective laminations in the laminating direction.

10. The laminated structure according claim 1,
wherein, of the plurality of plate-like members, a group of two or more plate-like members adjacent to each other and of the same configuration except for the identification structure portions are regarded as a single plate-like member, and
wherein positions and widths of the corresponding identification structure portions are made the same.

11. The laminated structure according to claim 1,
wherein the top portion and the bottom portion of the cutouts extend inward from the side edge of the plate-like members, and
wherein each of the top portions of the cutouts are connected to the corresponding bottom portion by a middle portion.

12. A laminated structure containing a plurality of plate-like members laminated in a predetermined order,
wherein said predetermined order of lamination is in a laminating direction,
wherein the plurality of plate-like members have a plurality of identification structure portions for individually identifying the plate-like members,
wherein the plurality of identification structure portions comprise respective protrusions,
wherein the plurality of identification structure portions are on the same side surface of a laminated structure thus obtained,
wherein the plurality of plate-like members have an identification side surface which makes up part of the side surface of the laminated structure on which the identification structure portions are provided,
wherein each of the protrusions have a top portion and a bottom portion which are spaced apart from each other in a direction which is perpendicular to the laminating direction and parallel to the side surface of the laminated structure on which the identification structure portions are provided, and
wherein the top portions and the bottom portions of the respective protrusions deviate sequentially such that both the top portions and the bottom portions of the respective protrusions are simultaneously provided farther away from a same reference plane, which is parallel to the laminating direction and parallel to a side surface of the laminated structure that intersects the side surface on which the identification structure portions are provided, as one travels in the laminating direction,
wherein a cross-section of the protrusions, taken along a plane parallel to the side surface on which the identification structure portions are provided, each have a diagonal line that extends from a front surface upper corner portion to a back surface lower portion, and all of the diagonal lines are arranged in a straight line,
wherein there is a predetermined ratio between the width of each of the identification structure portions and a thickness of each plate-like member in the laminating direction, and wherein at least one of the plate-like members has a thickness in the laminating direction which is different than a thickness of another one of the other plate-like members.

13. The laminated structure according to claim 12, wherein a width of each of the identification structure portions in a direction perpendicular to the laminating direction of the plate-like members is different from each other for each plate-like member.

14. The laminated structure according to claim 12, wherein the plurality of protrusions are arranged such that a position of a bottom portion a first protrusion is matched with a position of a top portion of an adjacent protrusion which is provided downstream from the first protrusion in a laminating direction.

15. A laminated structure comprising:
a plurality of plate-like members laminated in a predetermined order; and a plurality of identification structure portions for individually identifying the plate-like members provided on the plurality of plate-like members, wherein the plurality of identification structure portions are on the same side surface of a laminated structure thus obtained, wherein the plurality of the plate-like members comprise at least three plate-like members, wherein the plurality of identification structure portions respectively comprise cutouts, wherein the plurality of plate-like members are laminated in a laminating direction, wherein each of the cutouts have a top portion and a bottom portion which are spaced apart from each other in a direction which is perpendicular to the laminating direction and parallel to the side surface of the laminated structure on which the identification structure portions are provided, wherein each of the top portions and the bottom portions of the cutouts have an upper corner and a lower corner which are spaced apart from each other in the laminating direction such that each of the cutouts have an top upper corner, top lower corner, bottom upper corner, and bottom lower corner, and wherein at least one of all of the top upper corners, all of the top lower corners, all of the bottom upper corners, and all of the bottom lower corners of the cutouts are connected by a straight line, wherein each of the plurality of plate-like members have a thickness in the laminating direction, and wherein the thickness of at least one of the plurality of plate-like members is different than a thickness of another of the plate-like members.

16. A laminated structure comprising:

a plurality of plate-like members laminated in a predetermined order; and a plurality of identification structure portions for individually identifying the plate-like members provided on the plurality of plate-like members, wherein the plurality of identification structure portions are on the same side surface of a laminated structure thus obtained, wherein the plurality of the plate-like members comprise at least three plate-like members, wherein the plurality of identification structure portions respectively comprise protrusions, wherein the plurality of plate-like members are laminated in a laminating direction, wherein each of the protrusions have a top portion and a bottom portion which are spaced apart from each other in a direction which is perpendicular to the laminating direction and parallel to the side surface of the laminated structure on which the identification structure portions are provided, wherein each of the top portions and the bottom portions of the protrusions have an upper corner and a lower corner which are spaced apart from each other in the laminating direction such that each of the protrusions have a top upper corner, top lower corner, bottom upper corner, and bottom lower corner, and wherein at least one of all of the top upper corners, all of the top lower corners, all of the bottom upper corners, and all of the bottom lower corners of the protrusions are connected by a straight line, wherein each of the plurality of plate-like members have a thickness in the laminating direction, and wherein the thickness of at least one of the plurality of plate-like members is different than a thickness of another of the plate-like members.

* * * * *